(12) United States Patent
Wang

(10) Patent No.: US 12,119,283 B2
(45) Date of Patent: Oct. 15, 2024

(54) HEAT DISSIPATION STRUCTURE, METHOD FOR FORMING HEAT DISSIPATION STRUCTURE, AND SEMICONDUCTOR STRUCTURE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 393 days.

(21) Appl. No.: 17/669,514

(22) Filed: Feb. 11, 2022

(65) Prior Publication Data

US 2023/0011284 A1  Jan. 12, 2023

Related U.S. Application Data

(63) Continuation of application No. PCT/CN2021/117052, filed on Sep. 7, 2021.

(30) Foreign Application Priority Data

Jul. 7, 2021 (CN) .......................... 202110766667.2

(51) Int. Cl.
    *H01L 23/367* (2006.01)
    *H01L 21/48* (2006.01)
    *H01L 21/768* (2006.01)
    *H01L 23/48* (2006.01)

(52) U.S. Cl.
    CPC ........ *H01L 23/367* (2013.01); *H01L 21/4871* (2013.01); *H01L 21/76802* (2013.01); *H01L 21/76877* (2013.01); *H01L 23/481* (2013.01)

(58) Field of Classification Search
    CPC ............... H01L 23/367; H01L 21/4871; H01L 21/76802; H01L 21/76877; H01L 23/481
    See application file for complete search history.

(56) References Cited

U.S. PATENT DOCUMENTS

2014/0342502 A1\* 11/2014 Ma ...................... H01L 25/0657
                                                                     438/107

FOREIGN PATENT DOCUMENTS

CN           111653488 A        9/2020

\* cited by examiner

*Primary Examiner* — Julia Slutsker
(74) *Attorney, Agent, or Firm* — Kilpatrick Townsend & Stockton LLP

(57) ABSTRACT

Provided are a heat dissipation structure, a method for forming a heat dissipation structure, and a semiconductor structure. The heat dissipation structure includes a first heat dissipation ring and a second heat dissipation ring. The first heat dissipation ring is formed in a dielectric layer around a Through Silicon Via (TSV) and in contact with the TSV. The TSV passes through a silicon substrate and the dielectric layer. The second heat dissipation ring is formed around the first heat dissipation ring, and in contact with the first heat dissipation ring. The second heat dissipation ring has a heat dissipation gap within it. A dimension of the second heat dissipation ring in a first direction is less than that of the first heat dissipation ring in the first direction. The first direction is a thickness direction of the silicon substrate.

16 Claims, 8 Drawing Sheets

HEAT DISSIPATION STRUCTURE, METHOD FOR FORMING HEAT DISSIPATION STRUCTURE, AND SEMICONDUCTOR STRUCTURE

CROSS-REFERENCE TO RELATED APPLICATION

This is a continuation application of International Patent Application No. PCT/CN2021/117052, filed on Sep. 7, 2021, which claims priority to Chinese Patent Application No. 202110766667.2, filed on Jul. 7, 2021 and entitled "HEAT DISSIPATION STRUCTURE, METHOD FOR FORMING HEAT DISSIPATION STRUCTURE, AND SEMICONDUCTOR STRUCTURE". The disclosures of International Patent Application No. PCT/CN2021/117052 and Chinese Patent Application No. 202110766667.2 are incorporated by reference herein in their entireties.

TECHNICAL FIELD

The embodiments of the present disclosure relate to, but are not limited to, a heat dissipation structure, a method for forming a heat dissipation structure, and a semiconductor structure.

BACKGROUND

Due to the continuous improvement of chip integration, the number of device units on each chip has increased sharply, resulting in a continuous increase in an area of a chip. However, various electronic devices have higher requirements for the area, volume, power consumption, cost, and performance of the chip. Therefore, it gave rise to a three-dimensional integrated Through Silicon Via (TSV) vertical interconnection technology.

In the related art, since a TSV stacks multiple layers of chips together, a power density rises sharply. Greater heat and poor heat dissipation make the operating temperature of the chip rise. However, only the first layer of chip is adjacent to a heat sink so that heat dissipation is very difficult, resulting in an excessive heat density inside the chip, which seriously affects the reliability and stability of the TSV. In addition, a metal material in the TSV will expand and contract due to a thermal stress. This phenomenon easily causes stress deformation of a silicon substrate and a dielectric layer, which in turn affects the characteristics of elements in an Active Area (AA).

In addition, in the related art, one isolation dielectric layer (for example, SiO2) is generally arranged around the TSV to achieve electrical isolation from the silicon substrate. However, this will generate a Metal-Oxide-Semiconductor (MOS) capacitor. The MOS capacitor will cause a signal on the TSV to be coupled to the silicon substrate or surrounding devices and TSVs, resulting in signal distortion and leakage current, which increases the static power consumption of the chip.

SUMMARY

The first aspect of the present disclosure provide a heat dissipation structure, including: a first heat dissipation ring and a second heat dissipation ring. The first heat dissipation ring is formed in a dielectric layer around a Through Silicon Via (TSV) and is in contact with the TSV. The TSV passes through a silicon substrate of a chip and the dielectric layer located on a surface of the silicon substrate. The second heat dissipation ring is formed around the first heat dissipation ring and is in contact with the first heat dissipation ring. The interior of the second heat dissipation ring has a heat dissipation gap. A dimension of the second heat dissipation ring in a first direction is less than a dimension of the first heat dissipation ring in the first direction. The first direction is a thickness direction of the silicon substrate.

The second aspect of the present disclosure provide a method for forming a heat dissipation structure, including: providing a chip, the chip at least including a Through Silicon Via (TSV) passing through a silicon substrate and a dielectric layer; forming a first heat dissipation ring of the heat dissipation ring around the TSV in the dielectric layer in the dielectric layer, the first heat dissipation ring being in contact with the TSV; and forming a second heat dissipation ring of the heat dissipation structure around the first heat dissipation ring. The second heat dissipation ring is in contact with the first heat dissipation ring and has a heat dissipation gap in the interior thereof. A dimension of the second heat dissipation ring in a first direction is less than a dimension of the first heat dissipation ring in the first direction. The first direction is a thickness direction of the silicon substrate.

BRIEF DESCRIPTION OF THE DRAWINGS

In the drawings (not necessarily drawn according to a proportion), similar reference signs can describe similar parts in the different diagrams. Similar reference signs with different letter suffixes can represent different examples of the similar parts. The drawings almost show every embodiment discussed herein with examples rather than in a limiting manner.

DETAILED DESCRIPTION

The specific technical solutions of the invention will be further described in detail below in combination with accompanying drawings in the embodiments of the present disclosure. The embodiments below are used to illustrate the present disclosure, but are not intended to limit the scope of the present disclosure.

Based on the problems in the related art, the embodiments of the present disclosure provide a method for forming a heat dissipation structure. Heat conduction metal particles are deposited around a Through Silicon Via (TSV), and hollowed metal rings connected to one another are formed by depositing the heat conduction metal for multiple times. Heat generated by the TSV can be dissipated by the high heat conductivity of metal, thus effectively solving the problem of difficult heat dissipation of the TSV. In the embodiments of the present disclosure, the heat generated by the TSV is conducted by metals. The hollowed structures formed between the metals have a relatively large specific surface area, which is favorable for heat dissipation. Spaces between the hollowed metals are full of air that has an extremely low dielectric constant, so that signal distortion and leakage current caused by a Metal-Oxide-Semiconductor (MOS) capacitor of the TSV can be alleviated and the static power consumption of a chip can be reduced. In addition, the heat dissipation structure formed by the embodiments of the present disclosure is a heat dissipation ring of a step-shaped structure, which is not only favorable for upwards dissipating heat, but also can effectively reduce the occupancy of the area of an Active Area (AA), so as to avoid stress impact and temperature impact on devices around the TSV and effectively improve the heat dissipation efficiency.

Figure 1:
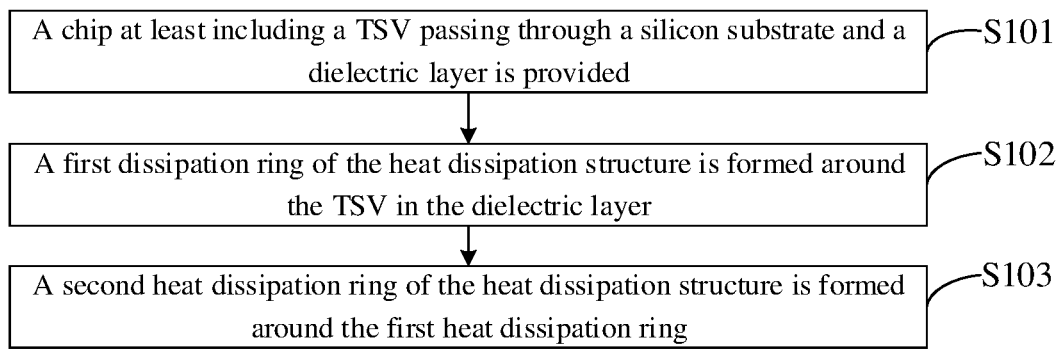
FIG. 1 is a flow chart of a method for forming a heat dissipation structure according to the embodiments of the present disclosure.

FIG. 1 is flow chart of a method for forming a heat dissipation structure according to the embodiments of the present disclosure. As shown in FIG. 1, the method includes the following operations.

At S101, a chip is provided. The chip at least includes a TSV passing through a silicon substrate and a dielectric layer.

Various active devices and circuits are formed inside the chip to realize a variety of functions. In the embodiments of the present disclosure, the chip at least includes the silicon substrate.

The TSV is a via formed inside the chip and passes through the silicon substrate of the chip. The TSV is filled with a conductive material to transmit a signal from a front surface of the chip to a back surface of the chip.

The silicon substrate may include a top surface located on the front face and a bottom surface located on the back face opposite to the front face. If the flatness of the top surface and the bottom surface of the silicon substrate is disregarded, a direction perpendicular to the top surface and the bottom surface of the silicon substrate is defined as a first direction, i.e., a thickness direction of the silicon substrate. In the top surface and the bottom surface of the silicon substrate (i.e., a plane where the silicon substrate is located), any direction is defined as a second direction. The first direction is perpendicular to the second direction. In the embodiments of the present disclosure, the first direction is defined as an X-axis direction and the second direction is defined as a Y-axis direction.

The dielectric layer is formed on a surface of the silicon substrate and is configured for protecting the silicon substrate. In the embodiments of the present disclosure, the dielectric layer may be a SiO2 layer or other insulation material layer.

At S102, a first heat dissipation ring of the heat dissipation structure is formed around the TSV in the dielectric layer.

The first heat dissipation ring is in contact with the TSV.

In the embodiments of the present disclosure, the first heat dissipation ring may pass through the dielectric layer, or may not pass through the dielectric layer. That is, a dimension of the first heat dissipation ring in the first direction is less than or equal to that of the dielectric layer in the first direction. The first heat dissipation ring is filled with a heat conduction metal material. Heat generated by the TSV is dissipated by the high heat conductivity of the metal material.

At S103, a second heat dissipation ring of the heat dissipation structure is formed around the first heat dissipation ring.

The second heat dissipation ring is in contact with the first heat dissipation ring and has a heat dissipation gap within the second heat dissipation. A dimension of the second heat dissipation ring in the first direction is less than that of the first heat dissipation ring in the first direction. The first direction is the thickness direction of the silicon substrate.

In the embodiments of the present disclosure, since the dimension of the second heat dissipation ring in the first direction is less than that of the first heat dissipation ring in the first direction, the first heat dissipation ring and the second heat dissipation ring form a step-shaped heat dissipation structure.

It should be noted that in the embodiments of the present disclosure, there may be one second heat dissipation ring, or may be at least two second heat dissipation rings. When the heat dissipation structure includes at least two heat dissipation rings, any two adjacent second heat dissipation rings are in contact with each other. The dimensions, in the first direction, of the at least two second heat dissipation rings extending towards the outside along the center of the TSV sequentially decrease.

In the embodiments of the present disclosure, since the TSV is formed in a keep-out-zone (KOZ) of the silicon substrate, the heat dissipation structure is also formed in the KOZ of the silicon substrate.

In the method for forming the heat dissipation structure according to the embodiments of the present disclosure, since the heat dissipation structure including the first heat dissipation ring and the second heat dissipation ring is formed at a periphery of the TSV, the heat generated by the TSV can be dissipated to the outside of the chip, thereby improving the reliability and stability of the TSV.

FIGS. 2A to 2L are views showing the method of forming a heat dissipation structure according to the embodiments of the present disclosure. The method for forming the heat dissipation structure according to the embodiments of the present disclosure is further described in detail with reference to FIGS. 2A to 2L.

Figure 2A:
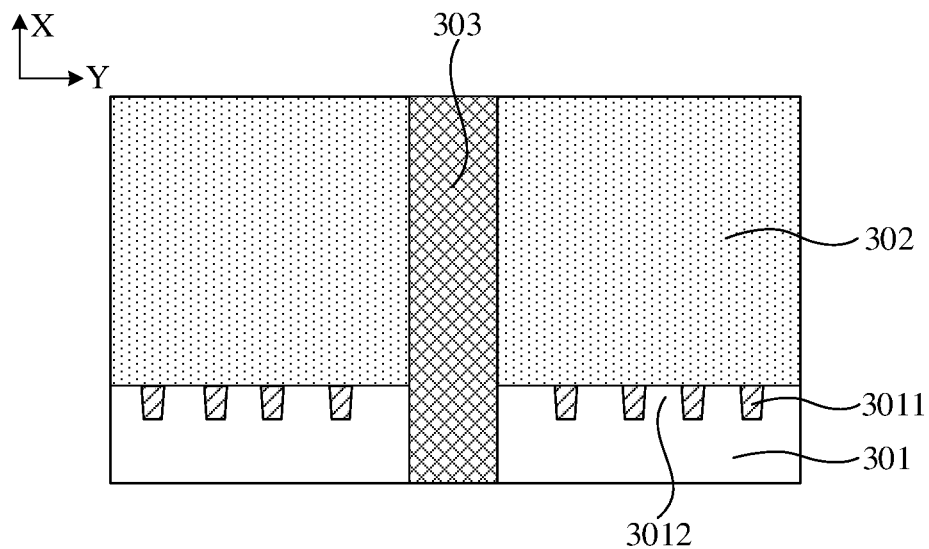
FIGS. 2A-2L are views of a method for forming a heat dissipation structure according to the embodiments of the present disclosure.

First, the S101 may be executed with reference to FIG. 2A. A chip is provided. The chip includes at least a TSV passing through a silicon substrate and a dielectric layer.

As shown in FIG. 2A, the chip at least includes a TSV 303 passing through a silicon substrate 301 and a dielectric layer 302. The dielectric layer 302 is located on a surface of the silicon substrate 301. The silicon substrate 301 includes a plurality of Active Areas (AAs) 3012 isolated from each other by Shallow Trench Isolations (STI) 3011.

In some embodiments, the TSV 303 may be formed by the following operations.

A silicon substrate and a dielectric layer located on an upper surface of the substrate are provided.

The dielectric layer and the silicon substrate are etched to form a blind hole structure in the silicon substrate, and a buffer layer, a barrier layer, and a conductive pillar are sequentially formed in the blind hole structure.

A bottom of the silicon substrate is thinned so that the blind hole structure passes through the substrate to form the TSV. A top metal contact layer is formed at a top of the conductive pillar, and a bottom metal contact layer is formed at a bottom of the conductive pillar.

In some embodiments, the buffer layer may be, for example, SiO2, which is configured to protect the silicon substrate from being damaged. A material of the barrier layer may be metal tantalum, tantalum nitride, or titanium nitride, etc. The barrier layer is configured to prevent diffusion of the metal material of the conductive pillar subsequently filled in the TSV. The metal material of the conductive pillar can be any kind of conductive metal, for example, tungsten (W), cobalt (Co), copper (Cu), aluminum (Al), etc., such as copper metal. Specifically, a copper conductive pillar may be obtained by depositing a copper seed crystal layer by Physical Vapor Deposition (PVD) and then electroplating copper. The TSV provides a conductive effect by means of a top metal contact layer and a bottom metal contact layer in the conductive pillar.

Figure 2B:
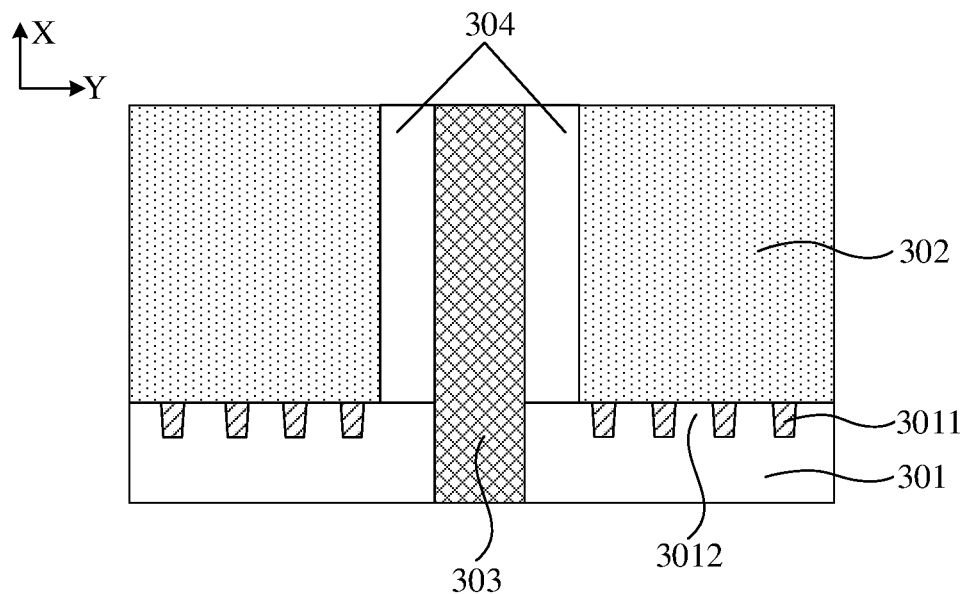
Figure 2C:
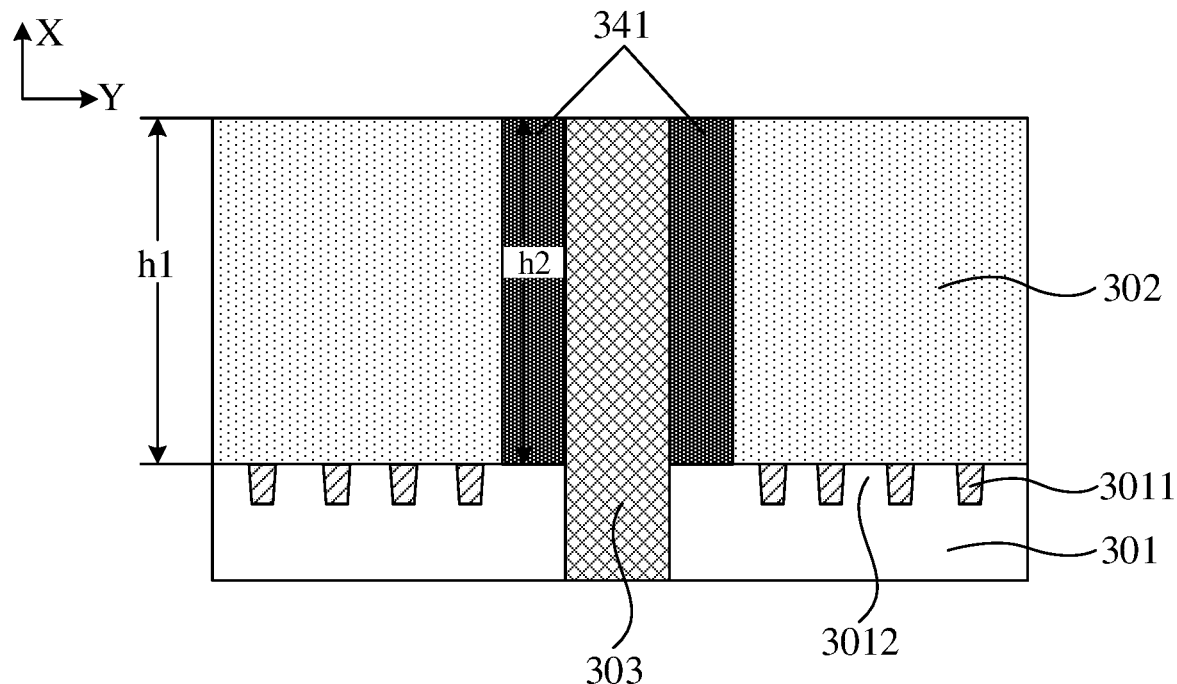

Next, the S102 may be executed, with reference to FIGS. 2B and 2C. A first heat dissipation ring of the heat dissipation structure is formed around the TSV in the dielectric layer.

In some embodiments, the S102 can be realized through the following operations.

The dielectric layer around the TSV is etched to form a first etched annulus.

As shown in FIG. 2B, a first etched annulus 304 is formed around the TSV 303, and the first etched annulus 304 is in contact with the TSV 303. In the embodiments of the present disclosure, the first etched annulus 304 runs through the dielectric layer 302 and is located above a surface of the AA 3012 in the silicon substrate 301.

In the embodiments of the present disclosure, the dielectric layer 302 around the TSV 303 may be etched by means of a dry etching process or a wet etching process to form the first etched annulus 304. The dry etching process may be a plasma etching process, a reactive ion etching process or an ion milling process.

In the embodiments of the present disclosure, when the dielectric layer around the TSV is etched to form the first etched annulus, the buffer layer, the barrier layer, and the conductive layer in the TSV are retained.

In other embodiments, when the dielectric layer around the TSV is etched to form the first etched annulus, the buffer layer in the TSV in the dielectric layer may also be removed, the buffer layer and the conductive pillar located in the TSV in the dielectric layer are retained, and the buffer layer, the barrier layer, and the conductive pillar in the TSV located in the silicon substrate are retained.

In the embodiments of the present disclosure, the first heat dissipation ring of the heat dissipation structure is formed by filling the first heat conduction metal material in the first etched annulus through spin-coating.

In other embodiments, the first heat conduction metal material may be filled by Chemical Vapor Deposition (CVD), PVD, Atomic Layer Deposition (ALD), or any suitable deposition process. The first heat conduction metal material may be W, Co, Cu, Al, gold (Au) or tantalum (Ta).

As shown in FIG. 2C, the first etched annulus 304 is filled, for example by spin-coating, with the first heat conduction metal material to form the first heat dissipation ring 341. The dimension h2 of the first heat dissipation ring 341 in the X-axis direction (i.e. height of the first heat dissipation ring) is equal to the dimension h1 of the dielectric layer in the X-axis direction. At this time, the first heat dissipation ring 341 surrounds the TSV 303 on the dielectric layer 302, so as to guarantee the heat dissipation effect by means of the heat conduction metal with good compactness and uniformity, and allow a good heat dissipation uniform. In addition, for ensuring the heat dissipation effect, the dimension of the first heat dissipation ring 341 in the Y-axis direction (i.e. width of the first heat dissipation ring) may be 0.1 μm to 2 μm, for example, 1.5 μm.

Next, the S103 may be executed, with reference to FIGS. 2A to 2L. A second heat dissipation ring of the heat dissipation structure is formed around the first heat dissipation ring.

In some embodiments, the S103 can be implemented through the following operations.

The dielectric layer around the first heat dissipation ring is etched to form a second etched annulus.

Figure 2D:
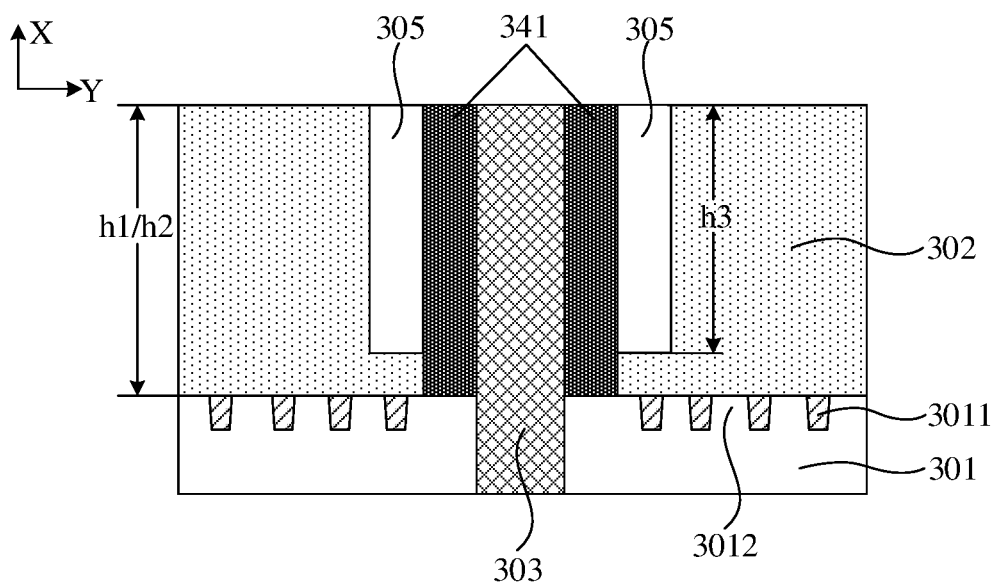

As shown in FIG. 2D, a second etched annulus 305 is formed around the first heat dissipation ring 341 by etching the dielectric layer, and the second etched annulus 305 is in contact with the first heat dissipation ring 341. The dimension h3 of the second etched annulus 305 in the X-axis direction is less than the dimension h2 of the first heat dissipation ring 341 in the X-axis direction, so that a dimension of the subsequently formed second heat dissipation ring in the X-axis direction is less than that of the first heat dissipation ring 341, which ensures that the outermost layer of heat dissipation ring has a relatively small area and has a good heat dissipation effect. The first heat dissipation ring and the second heat dissipation ring form a step-shape. This is conducive to upwards dissipating heat, avoiding the influence on bottom elements around the TSV, and also reducing the impact of stress.

In some embodiments, the dimension of the subsequently formed second heat dissipation ring in the X-axis direction is reduced by about 10%-20%, such as 18%, compared to this dimension of the first heat dissipation ring.

A second heat conduction metal material of a predetermined volume is deposited, by a predetermined deposition process, on a sidewall and bottom of the second etched annulus.

Figure 2E:
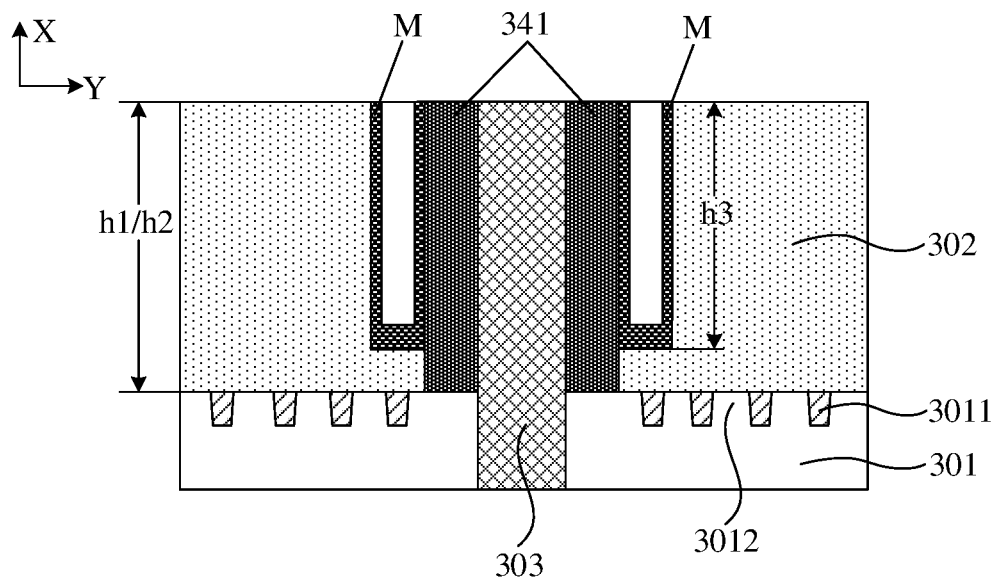

In the embodiments of the present disclosure, the predetermined deposition process may be CVD, PVD, ALD or any suitable deposition process. The second heat conduction metal material may be tungsten, cobalt, copper, aluminum, gold or tantalum. The predetermined volume is less than the total volume of the second etched annulus. The predetermined volume is greater than or equal to 10% of the total volume of the second etched annulus, and is less than or equal to 70% of the total volume of the second etched annulus. In the embodiments of the present disclosure, the heat conduction metal material of the predetermined volume is deposited on the bottom and sidewall of the second etched annulus to form a hollowed metal ring, which is conductive to heat dissipation and also reduces the manufacturing cost of the heat dissipation structure. As shown in FIG. 2E, a second heat conduction metal material M having a volume of 10%-70% of the total volume of the second etched annulus is deposited on the sidewall and bottom of the second etched annulus 305.

A closure is formed at the top of the second etched annulus in which the second heat conduction metal material is deposited, so as to form the second heat dissipation ring of the heat dissipation structure.

In some embodiments, the formation of a closure at the top of the second etched annulus in which the second heat conduction metal material is deposited may include the following operations.

A closure material is deposited by CVD process at the top of the second etched annulus in which the second heat conduction metal material is deposited, so as to form the closure.

In the embodiments of the present disclosure, the closure is configured to close the top of the second etched annulus, and the closure material includes any kind of insulation material, for example, $SiO_2$.

Figure 2F:
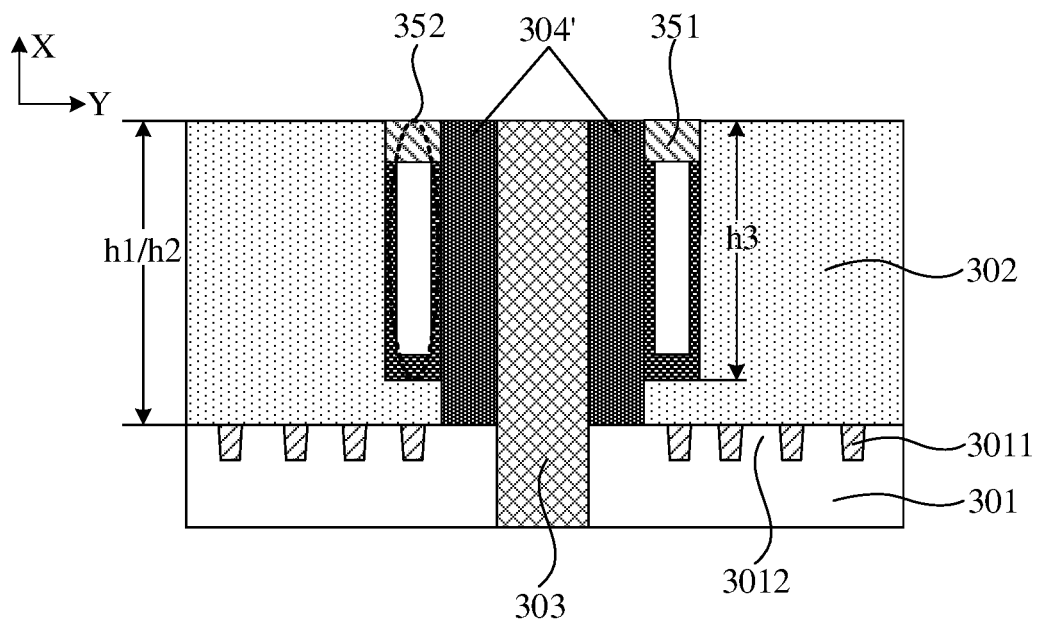

As shown in FIG. 2F, a closure material is deposited at the top of the second etched annulus 305 in which the second heat conduction metal material is deposited, so as to form a closure 351, and then the second heat dissipation ring 352 is formed. A dimension h3 of the second heat dissipation ring 352 in the X-axis direction is less than the dimension h2 of the first heat dissipation ring 341 in the X-axis direction.

In the embodiments of the present disclosure, since only the second heat conduction metal material of the predetermined volume is deposited in the second etched annulus, and the predetermined volume is less than the total volume of the second etched annulus, a gap is formed inside the second etched annulus, which is conductive to heat dissipation. In addition, there is a dielectric substance having a relatively low dielectric constant in the gap, which can improve the MOS capacitor problem caused by the TSV. In some embodiments, the dielectric substance may be air.

In the embodiments of the present disclosure, since the heat conduction metal materials are filled in the first heat dissipation ring and the second heat dissipation ring, the heat generated by the TSV can be conducted through the heat conduction metal materials. The hollowed structure formed between the heat conduction metals has a relatively large specific surface area, which is conductive to heat dissipation. In addition, since the dimension of the second heat dissipation ring in the first direction is less than the dimension of the first heat dissipation ring in the first direction, a step-shaped heat dissipation structure can be formed, which can effectively reduce the occupancy of the area of the AA, reduce the stress impact and temperature impact on devices around the TSV, and improve the heat dissipation efficiency.

In some embodiments, the first heat conduction metal material in the first heat dissipation ring is the same as or different from the second heat conduction metal material in the second heat dissipation ring.

In some embodiments, the heat dissipation structure includes at least two second heat dissipation rings. In the embodiments of the present disclosure, the heat dissipation structure including three second heat dissipation rings is taken as an example for description.

It should be note that the foregoing FIGS. 2D to 2F illustrate a process of forming one second heat dissipation ring (that is, the first one of second heat dissipation rings), and the second etched annulus 305 is the second one of the etched annuluses of the embodiments of the present disclosure. The second heat dissipation ring 352 is the second one of the second heat dissipation rings in the embodiments of the present disclosure.

Next, a process of forming the second one of the second heat dissipation rings in the embodiments of the present disclosure will be described with reference to FIGS. 2G to 2I. The process of forming the second one of the second heat dissipation rings includes the following operations.

The dielectric layer around the first one of the second heat dissipation rings is etched to form the second one of second etched annuluses.

Figure 2G:
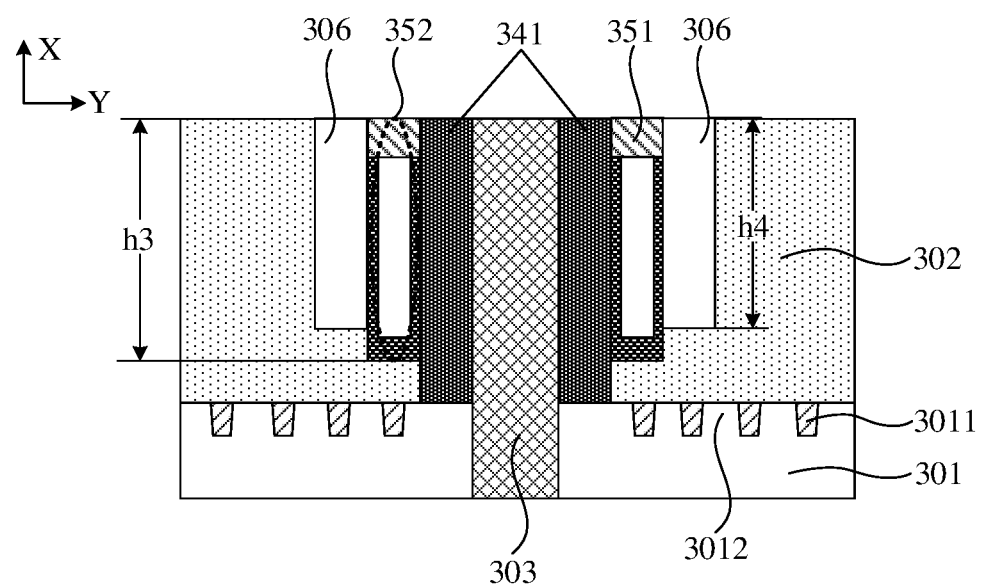

As shown in FIG. 2G, the second one 306 of second etched annuluses is formed by etching the dielectric layer around the first one 352 of second heat dissipation rings, and the second one 306 of second etched annuluses is in contact with the first one 352 of second heat dissipation rings. A dimension h4 of the second one 306 of second etched annuluses in the X-axis direction is less than the dimension h3 of the first one 352 of second heat dissipation rings in the X-axis direction. In the embodiments of the present disclosure, a step is formed between the second one of second heat dissipation rings and the first one of second heat dissipation rings, which is conductive to upwards dissipating heat, avoiding the influence on bottom elements around the TSV, and also reducing the impact of stress.

In some embodiments, the dimension of the second one of second heat dissipation rings in the X-axis direction is reduced by about 10%-20%, such as 11%, compared to the dimension of the first one of second heat dissipation rings.

A second heat conduction metal material of a predetermined volume is deposited, by the predetermined deposition process, on a sidewall and bottom of the second one of second etched annuluses.

Figure 2H:
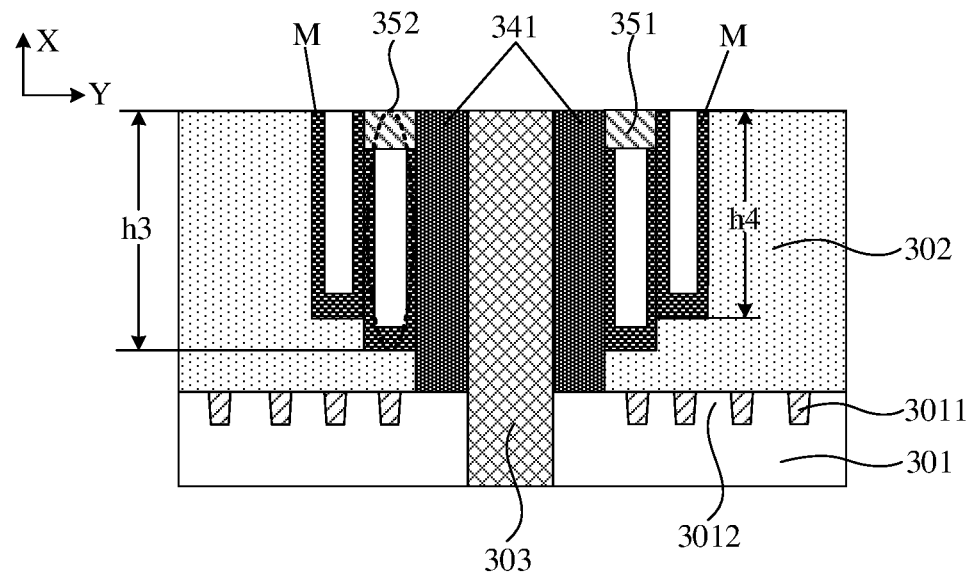

As shown in FIG. 2H, a second heat conduction metal material M having a volume of 10%-70% of the total volume of second one of the second etched annuluses is deposited on the sidewall and bottom of the second one 306 of second etched annuluses.

In the embodiments of the present disclosure, since only the second heat conduction metal material of the predetermined volume is deposited in the second one of second etched annuluses, and the predetermined volume is less than the total volume of the second one of the second etched annuluses, a gap is formed inside the second one of second etched annuluses, which is conductive to heat dissipation.

A closure is formed at the top of the second one of second etched annuluses in which the second heat conduction metal material is deposited, so as to form the second one of second heat dissipation rings of the heat dissipation structure.

In the embodiments of the present disclosure, the process of forming the closure at the top of the second one of second etched annuluses is the same as the process of forming the closure at the top of the first one of second etched annuluses in the above embodiment, and descriptions thereof will not be repeated here.

Figure 2I:
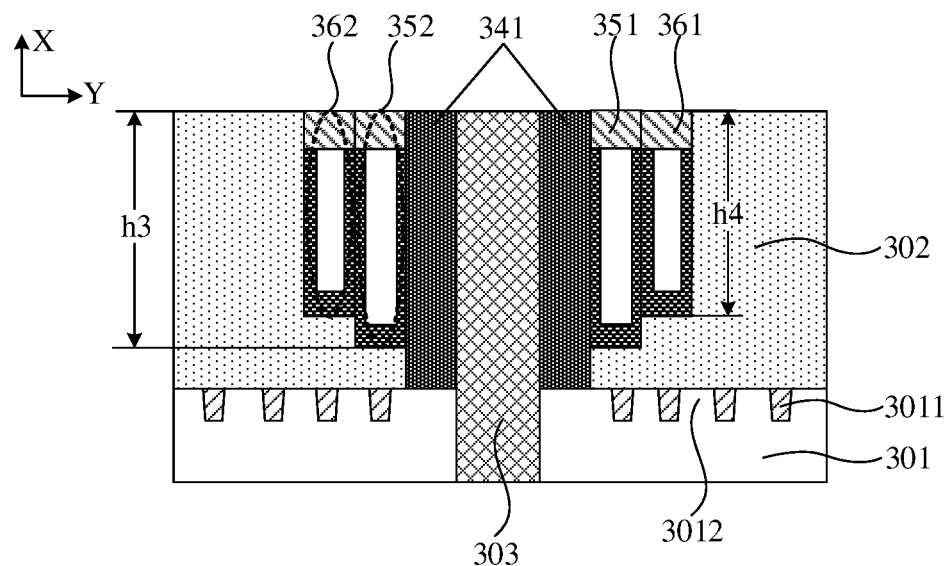

As shown in FIG. 2I, a closure material is deposited at the top of the second one 306 of second etched annuluses in which the second heat conduction metal material M is deposited, so as to form a closure 361, and then the second one 362 of second heat dissipation rings is formed. A dimension h4 of the second one 362 of second heat dissipation rings in the X-axis direction is less than the dimension h3 of the first one 352 of second heat dissipation rings in the X-axis direction. In the embodiments of the present disclosure, a step is formed between the third one of the second heat dissipation rings and the second one of second heat dissipation rings, which is conductive to upwards dissipating heat, avoiding the influence on bottom elements around the TSV, and also reducing the impact of stress.

In some embodiments, the dimension of the third one of the heat dissipation rings in the X-axis direction is reduced by about 10%-20%, such as 15%, compared to the dimension of the second one of second heat dissipation rings.

A process of forming the third one of the second heat dissipation rings in the embodiments of the present disclosure can be described with reference to FIGS. 2J to 2L. The process of forming the third one of the second heat dissipation rings includes the following operations.

The dielectric layer around the second one of second heat dissipation rings is etched to form a third one of the second etched annuluses.

In the embodiments of the present disclosure, the process of forming the third one of the second etched annuluses is the same as the process of forming the first one of second etched annuluses in the above embodiment, and descriptions thereof will not be repeated here.

Figure 2J:
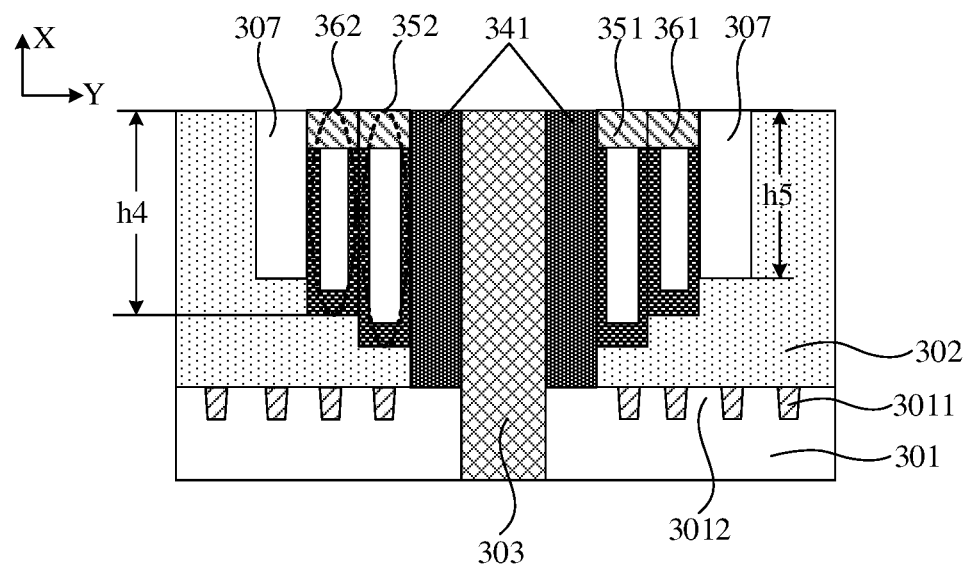

As shown in FIG. 2J, a third one 307 of the second etched annuluses is formed by etching the dielectric layer around the second one 362 of the second heat dissipation rings, and the third one 307 of the second etched annuluses is in contact with the second one 362 of the second heat dissipation rings. A dimension h5 of the third one 307 of the second etched annuluses in the X-axis direction is less than the dimension h4 of the second one 362 of second heat dissipation rings in the X-axis direction.

A second heat conduction metal material of a predetermined volume is deposited, by the predetermined deposition process, on a sidewall and bottom of the third one of the second etched annuluses.

In the embodiments of the present disclosure, the process of depositing the second heat conduction metal material in the third one of the second etched annuluses is the same as the process of depositing the second heat conduction metal material in the first one of second etched annuluses, and descriptions thereof will not be repeated here.

Figure 2K:
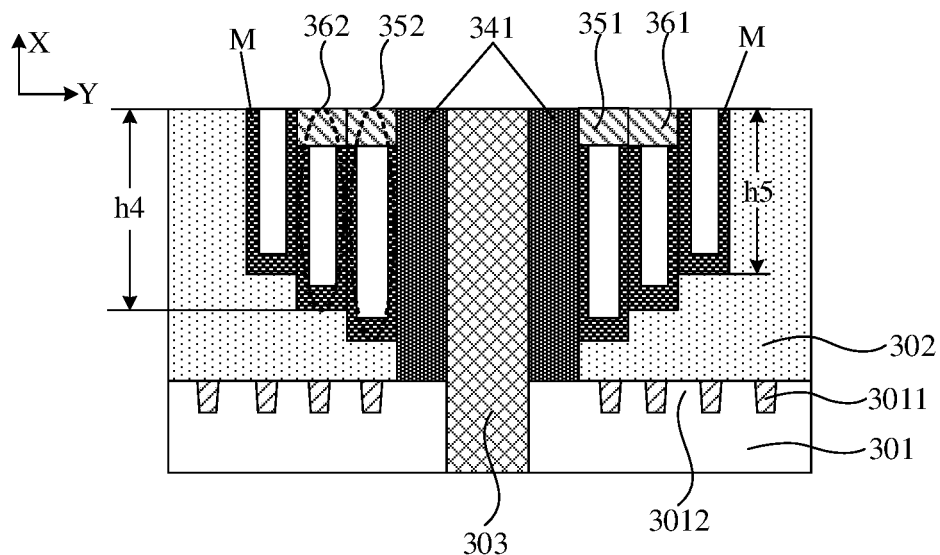

As shown in FIG. 2K, a second heat conduction metal material M having a volume of 10%-70% of the total volume of the third one 307 of the second etched annuluses is deposited on the sidewall and bottom of the third one 307.

In the embodiments of the present disclosure, since only the second heat conduction metal material of the predetermined volume is deposited in the third one of the second etched annuluses, and the predetermined volume is less than the total volume of the third one of second etched annuluses, a gap is formed inside the third one of second etched annuluses, which is conductive to heat dissipation.

A closure is formed at the top of the third one of the second etched annuluses in which the second heat conduction metal material is deposited, so as to form the third one of the second heat dissipation rings of the heat dissipation structure.

In the embodiments of the present disclosure, the process of forming the closure at the top of the third one of the second etched annuluses is the same as the process of forming the closure at the top of the first one of second etched annuluses in the above embodiment, and descriptions thereof will not be repeated here.

Figure 2L:
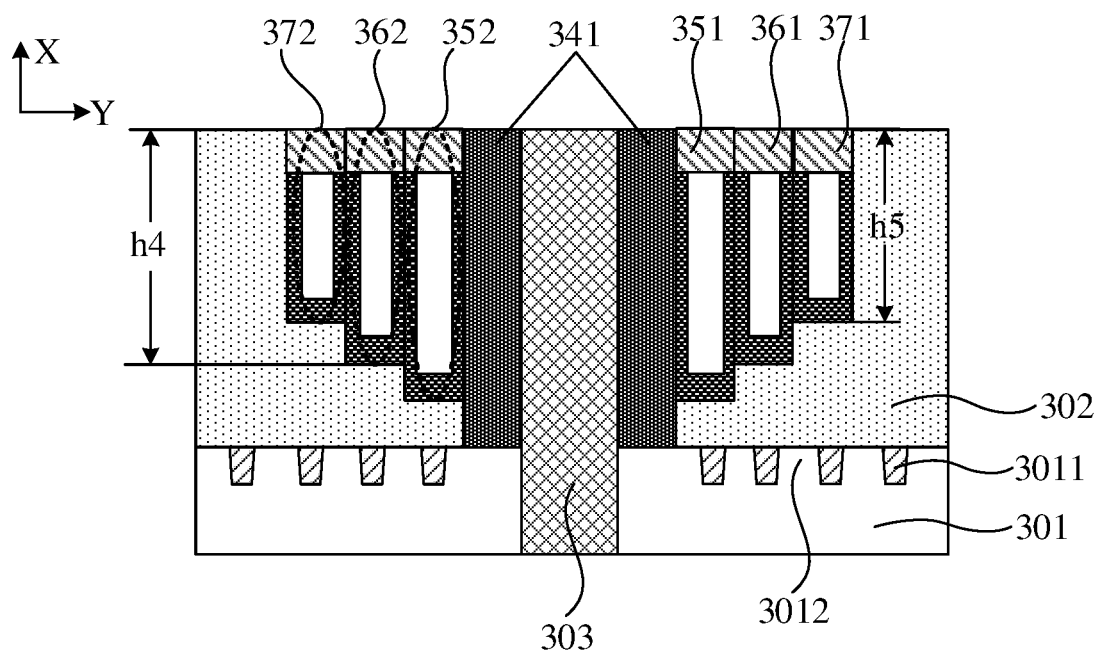

As shown in FIG. 2L, a closure material is deposited at the top of the third one 307 of the second etched annuluses in which the second heat conduction metal material M is deposited, so as to form a closure 371, and then the third one 372 of the second heat dissipation rings is formed. A dimension h5 of the third one 372 of the second heat dissipation rings in the X-axis direction is less than the dimension h4 of the second one 362 of second heat dissipation rings in the X-axis direction.

In the embodiments of the present disclosure, the second heat conduction metal material may be tungsten, cobalt, copper, or aluminum. The second heat conduction metal materials filled in the first one of second etched annuluses, the second one of second etched annuluses, and the third one of the second etched annuluses may be the same or different.

It should be noted that the embodiments of the present disclosure exemplarily illustrate three second etched annuluses. In an actual process, the number of the second etched annuluses is not limited to this.

In the embodiments of the present disclosure, the dimension of the third one of the second heat dissipation rings in the first direction is less than the dimension of the second one of the second heat dissipation rings in the first direction, the dimension of the second one of second heat dissipation rings in the first direction is less than the dimension of the first one of second heat dissipation rings in the first direction, and the dimension of the first one of second heat dissipation rings in the first direction is less than the dimension of the first heat dissipation ring in the first direction. Therefore, in the embodiments of the present disclosure, the formed heat dissipation structure is step-shaped, which can effectively reduce the occupancy of the area of the AA, reduce the stress impact and temperature impact on the devices around the TSV, and effectively improve the heat dissipation efficiency.

The embodiments of the present disclosure provide a hollowed TSV heat dissipation structure. Heat conduction metal particles are deposited around the TSV, and hollowed metal rings connected to one another are formed by depositing heat conduction metals for multiple times, so that the problem of difficult heat dissipation of the TSV can be effectively solved. Heat generated by the TSV is conducted through metals. The hollowed structures formed between the metals have relatively large specific surface areas, which is conductive to heat dissipation. In another aspect, since there is an air gap in the heat dissipation structure, and the air has a very low dielectric constant, the signal distortion and leakage current caused by the MOS capacitor of the TSV can be alleviated, and the static power consumption of the chip can be reduced.

Figure 3:
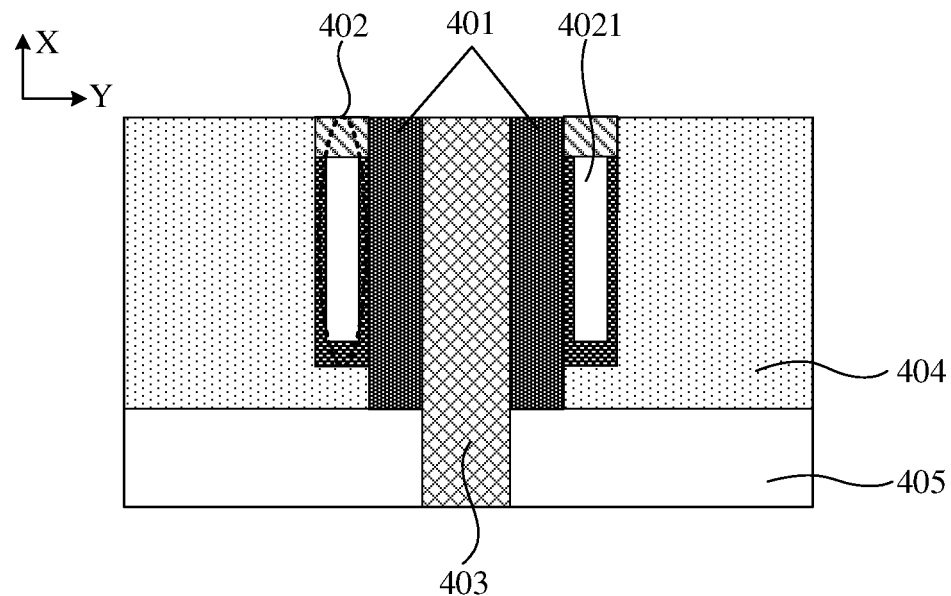
FIG. 3 is a schematic view of a heat dissipation structure according to the embodiments of the present disclosure.

The embodiments of the present disclosure also provide a heat dissipation structure for dissipating the heat generated by the TSV. FIG. 3 is one optional schematic view of a heat dissipation structure according to the embodiments of the present disclosure. As shown in FIG. 3, the heat dissipation structure includes a first heat dissipation ring 401 and a second heat dissipation ring 402.

The first heat dissipation ring 401 is formed in a dielectric layer 404 around a TSV 403. The first heat dissipation ring 401 is in contact with the TSV 403. The TSV 403 passes through the silicon substrate 405 of the chip and the dielectric layer 404 located on a surface of the silicon substrate.

The second heat dissipation ring 402 is formed around the first heat dissipation ring 401. The second heat dissipation ring 402 is in contact with the first heat dissipation ring 401. The interior of the second heat dissipation ring 402 has a heat dissipation gap 4021. A dimension of the second heat dissipation ring in a first direction is less than a dimension of the first heat dissipation ring in the first direction. The first direction is a thickness direction of the silicon substrate.

In the embodiments of the present disclosure, the first direction is defined as an X-axis direction, and a second direction is defined as a Y-axis direction perpendicular to the first direction.

In the embodiments of the present disclosure, a first heat conduction metal material is filled in the first heat dissipation ring. A second heat conduction metal material of a predetermined volume is filled in the second heat dissipation ring. The first heat conduction metal material is the same as or different from and the second heat conduction metal material.

In the embodiments of the present disclosure, the second heat conduction metal material is deposited on a bottom and sidewall of the second heat dissipation ring. The predetermined volume is less than the total volume of the second heat dissipation ring. The predetermined volume is greater than or equal to 10% of the total volume of the second heat dissipation ring. In addition, the predetermined volume is less than or equal to 70% of the total volume of the second heat dissipation ring.

In some embodiments, the dimension of the second heat dissipation ring in the second direction is 0.1 μm to 1 μm. The second direction is perpendicular to the first direction.

In the embodiments of the present disclosure, since the heat conduction metal materials are filled in the first heat dissipation ring and the first one of second heat dissipation rings, the heat generated by the TSV can be conducted through the heat conduction metals. The hollowed structure formed between the heat conduction metals has a relatively large specific surface area, which is conductive to heat dissipation. In addition, since the dimension of the second heat dissipation ring in the first direction is less than the dimension of the first heat dissipation ring in the first direction, a step-shaped heat dissipation structure can be formed, which can effectively reduce the occupancy of the area of an AA, reduce the stress impact and temperature impact on devices around the TSV, and improve the heat dissipation efficiency.

In some embodiments, the heat dissipation structure includes at least two second heat dissipation rings, and any two adjacent second heat dissipation rings are in contact with each other. Dimensions in the X axis, of the at least two second heat dissipation rings arranged successively in a direction from center of the TSV to the outside, sequentially decrease.

In some embodiments, the dimensions of any two second heat dissipation rings in the second direction are the same or different. For example, when the heat dissipation structure includes two second heat dissipation rings, the dimension of the first one of second heat dissipation rings in the Y-axis direction may be 0.5 μm, and the dimension of the second one of second heat dissipation rings in the Y-axis direction may be 0.5 μm, or the dimension of the second one of second heat dissipation rings in the Y-axis direction may also be 0.8 μm.

In some embodiments, a first dimension difference in the first direction between the first heat dissipation ring and the second heat dissipation ring adjacent to it, is different from or the same as a second dimension difference in the first direction between any two adjacent second heat dissipation rings. Any two adjacent second heat dissipation rings may have the same dimension or different dimensions in the first direction.

The method for forming the heat dissipation structure in the embodiment of the present disclosure is similar to the method for forming the heat dissipation structure in the above embodiments. Technical features that are not disclosed in detail in the embodiments of the present disclosure can be understood with reference to the foregoing embodiments. Descriptions thereof are omitted here.

Due to the hollowed metal rings of the heat dissipation structure, the heat dissipation structure according to the embodiments of the present disclosure can effectively solve the heat dissipation problem of the TSV. The heat generated by the TSV is conducted through the heat conduction metals. The hollowed structures formed between the heat conduction metals have relatively large specific surface areas, which is conductive to heat dissipation. In another aspect, since there is an air gap in the heat dissipation structure of the embodiments of the present disclosure and the air has a very low dielectric constant, the signal distortion and leakage current caused by the MOS capacitor of the TSV can be alleviated, and the static power consumption of the chip can be reduced.

Figure 4:
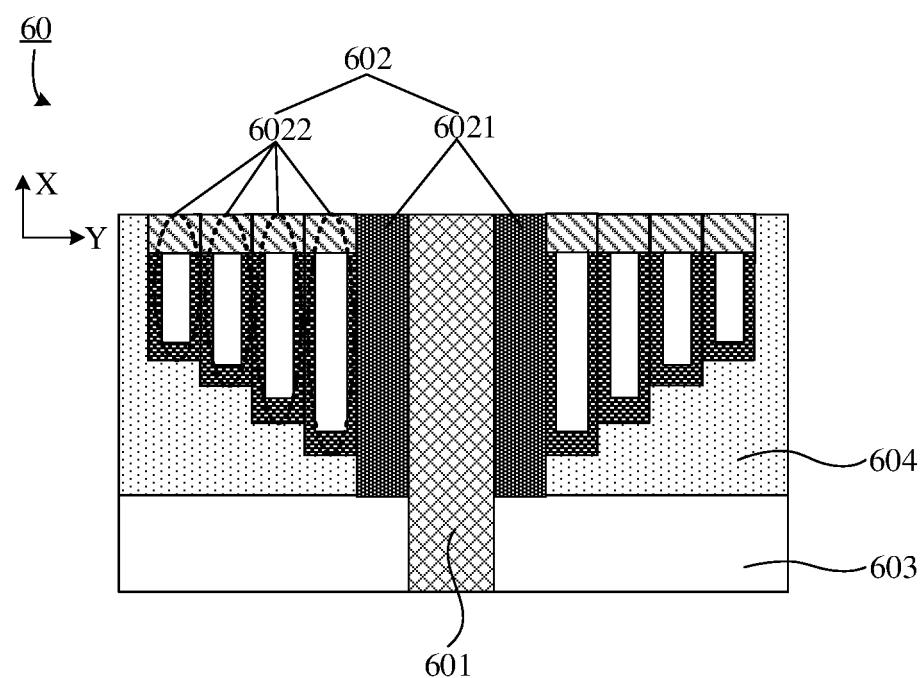
FIG. 4 is a schematic view of a semiconductor structure according to the embodiments of the present disclosure.

In addition, the embodiments of the present disclosure further provide a semiconductor structure. FIG. 4 is one optional schematic view of a semiconductor structure according to the embodiments of the present disclosure. As shown in FIG. 4, the semiconductor structure 60 includes a TSV 601 and a heat dissipation structure 602.

The TSV 601 passes through the silicon substrate 603 and a dielectric layer 604 located on a surface of the silicon substrate.

The heat dissipation structure 602 is formed in the dielectric layer around the TSV 601, and the heat dissipation structure 602 is in contact with the TSV 601.

In the embodiments of the present disclosure, the heat dissipation structure is configured to dissipate heat generated by the TSV.

In some embodiments, the heat dissipation structure includes a first heat dissipation ring 6021 and at least one second heat dissipation ring 6022. The first heat dissipation ring is in contact with the TSV. The second heat dissipation ring is in contact with the first heat dissipation ring, and has a heat dissipation gap in the interior of the second heat dissipation ring. A dimension of the second heat dissipation ring in the first direction is less than that of the first heat dissipation ring in the first direction. The first direction is a thickness direction of the silicon substrate.

In some embodiments, any two adjacent second heat dissipation rings are in contact with each other. Dimensions, in the first direction, of the at least two second heat dissipation rings extending to the outside along the center of the TSV sequentially decrease.

The heat dissipation structure in the semiconductor structure according to the embodiments of the present disclosure is similar to the heat dissipation structure or the method for forming the heat dissipation structure in the foregoing embodiment. Technical features that are not disclosed in detail in the embodiments of the present disclosure are understood with reference to the foregoing embodiments. Descriptions thereof are omitted here.

The semiconductor structure according to the embodiments of the present disclosure includes a heat dissipation structure located on an outer side of the TSV. By means of the heat dissipation structure, the heat generated by the TSV can be dissipated, thereby improving the electrical performance of the semiconductor structure while improving the reliability and stability of the STV.

The device in the embodiments described above are merely illustrative. In actual implementation, there may be another manner. For example, a plurality of units or components may be combined, or integrated into another system, or some features may be ignored or not executed. In addition, all the components illustrated or discussed may be coupled or directly coupled to each other.

The features disclosed in the several method or device embodiments provided in the present disclosure can be combined arbitrarily without conflict to obtain a new method embodiment or device embodiment.

The foregoing descriptions are merely implementation modes of the present disclosure, but the protection scope of the present disclosure is not limited thereto. Any person skilled in the art can easily think that changes or replacements within the technical scope disclosed in the present disclosure shall fall within the protection scope of the present disclosure. Therefore, the protection scope of the present disclosure should be subject to the appended claims.

The invention claimed is:

1. A heat dissipation structure, comprising
a first heat dissipation ring and at least one second heat dissipation ring, wherein
the first heat dissipation ring is formed in a dielectric layer around a Through Silicon Via (TSV) and is in contact with the TSV, wherein the TSV passes through a silicon substrate of a chip and the dielectric layer located on a surface of the silicon substrate;
the second heat dissipation ring is formed around the first heat dissipation ring and is in contact with the first heat dissipation ring, the second heat dissipation ring has a heat dissipation gap in an interior of the second heat dissipation ring, a dimension of the second heat dissipation ring in a first direction is less than a dimension of the first heat dissipation ring in the first direction, and the first direction is a thickness direction of the silicon substrate.

2. The heat dissipation structure of claim 1, wherein
the heat dissipation structure comprises at least two second heat dissipation rings, and any two adjacent second heat dissipation rings are in contact with each other;
the dimensions, in the first direction, of the at least two second heat dissipation rings arranged successively in a direction from a center of the TSV to an outside of the TSV, sequentially decrease.

3. The heat dissipation structure of claim 2, wherein
a first heat conduction metal material is filled in the first heat dissipation ring, and a second heat conduction metal material of a predetermined volume is filled in each second heat dissipation ring;
the first heat conduction metal material is the same as or different from the second heat conduction metal material.

4. The heat dissipation structure of claim 3, wherein
the second heat conduction metal material is deposited on a bottom and sidewall of the second heat dissipation ring;
the predetermined volume is greater than or equal to 10% of a total volume of a second etched annulus;
and the predetermined volume is less than or equal to 70% of the total volume of the second etched annulus.

5. The heat dissipation structure of claim 2, wherein
the dimension of the second heat dissipation ring in a second direction is 0.1 μm to 1 μm;
the dimensions in the second direction of any two second heat dissipation rings are the same or different, and the second direction is perpendicular to the first direction.

6. The heat dissipation structure of claim 2, wherein
a first dimension difference in the first direction between the first heat dissipation ring and the second heat dissipation ring adjacent to the first heat dissipation ring, and a second dimension difference in the first direction between any two adjacent second heat dissipation rings, are the same or different;
the dimension differences in the first direction of any two adjacent second heat dissipation rings are the same or different.

7. A method for forming a heat dissipation structure, comprising:
providing a chip at least comprising a through silicon via (TSV) passing through a silicon substrate and a dielectric layer;
forming a first heat dissipation ring of the heat dissipation structure around the TSV in the dielectric layer, wherein the first heat dissipation ring is in contact with the TSV; and
forming a second heat dissipation ring of the heat dissipation structure around the first heat dissipation ring, wherein the second heat dissipation ring is in contact with the first heat dissipation ring; the second heat dissipation ring has a heat dissipation gap in an interior of the second heat dissipation ring; a dimension of the second heat dissipation ring in a first direction is less than a dimension of the first heat dissipation ring in the first direction; and the first direction is a thickness direction of the silicon substrate.

8. The method for forming the heat dissipation structure of claim 7, wherein
the heat dissipation structure comprises at least two second heat dissipation rings, and any two adjacent second heat dissipation rings are in contact with each other;
the dimensions, in the first direction, of the at least two second heat dissipation rings arranged successively in a direction from a center of the TSV to an outside of the TSV, sequentially decrease.

9. The method for forming the heat dissipation structure of claim 7, wherein
the forming a first heat dissipation ring of the heat dissipation structure around the TSV in the dielectric layer comprises:
etching the dielectric layer around the TSV to form a first etched annulus in contact with the TSV; and
filling the first etched annulus with a first heat conduction metal material to form the first heat dissipation ring of the heat dissipation structure.

10. The method for forming the heat dissipation structure of claim 9, wherein
the forming a second heat dissipation ring of the heat dissipation structure around the first heat dissipation ring comprises:
etching the dielectric layer around the first heat dissipation ring to form a second etched annulus in contact with the first heat dissipation ring;
depositing a second heat conduction metal material of a predetermined volume on a sidewall and a bottom of the second etched annulus by a predetermined deposition process; and
forming a closure at a top of the second etched annulus in which the second heat conduction metal material is deposited, to form the second heat dissipation ring of the heat dissipation structure.

11. The method for forming the heat dissipation structure of claim 10, wherein
the predetermined volume is greater than or equal to 10% of a total volume of the second etched annulus;
and the predetermined volume is less than or equal to 70% of the total volume of the second etched annulus;
the predetermined deposition process comprises a chemical vapor deposition (CVD) process or a physical vapor deposition (PVD) process.

12. The method for forming the heat dissipation structure of claim 10, wherein
the forming a closure at the top of the second etched annulus in which the second heat conduction metal material is deposited comprises:
depositing, by a chemical vapor deposition (CVD) process, a closure material at the top of the second etched annulus in which the second heat conduction metal material is deposited, to form the closure;
wherein a material of the closure comprises an insulation material.

13. The method for forming the heat dissipation structure of claim 10, wherein
the first heat conduction metal material is the same as or different from the second heat conduction metal material;
the first heat conduction metal material and the second heat conduction metal material at least comprise one of tungsten, cobalt, copper, aluminum, gold, or tantalum.

14. The method for forming the heat dissipation structure of claim 9, wherein
at least a buffer layer, a barrier layer and a conductive pillar are successively formed in the TSV; and
wherein the etching the dielectric layer around the TSV to form a first etched annulus comprises:
etching the dielectric layer around the TSV by a dry etch process or a wet etch process with the buffer layer, the barrier layer and the conductive pillar being retained in the TSV, to form the first etched annulus.

15. A semiconductor structure, at least comprising
a Through Silicon Via (TSV) and a heat dissipation structure comprising a first heat dissipation ring and at least one second heat dissipation ring, wherein
the first heat dissipation ring is formed in a dielectric layer around the TSV and is in contact with the TSV, wherein the TSV passes through a silicon substrate of a chip and the dielectric layer located on a surface of the silicon substrate;
the second heat dissipation ring is formed around the first heat dissipation ring and is in contact with the first heat dissipation ring, the second heat dissipation ring has a heat dissipation gap in an interior of the second heat dissipation ring, a dimension of the second heat dissipation ring in a first direction is less than a dimension of the first heat dissipation ring in the first direction, and the first direction is a thickness direction of the silicon substrate;
the heat dissipation structure is formed in the dielectric layer around the TSV, and the heat dissipation structure is in contact with the TSV.

16. The heat dissipation structure of claim 1, wherein
a closure is formed on the second heat dissipation ring to covering the heat the second heat dissipation ring, and a material of the closure comprises an insulation material.

* * * * *